US012805161B2

(12) United States Patent
Kim

(10) Patent No.: US 12,805,161 B2
(45) Date of Patent: Nov. 17, 2026

(54) DISPLAY APPARATUS FOR PREVENTING DEFECTS DUE TO STRETCHING

(71) Applicant: LG Display Co., Ltd., Seoul (KR)

(72) Inventor: Byoung-Chul Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 434 days.

(21) Appl. No.: 18/532,925

(22) Filed: Dec. 7, 2023

(65) Prior Publication Data

US 2024/0224733 A1 Jul. 4, 2024

(30) Foreign Application Priority Data

Dec. 28, 2022 (KR) ........................ 10-2022-0186713

(51) Int. Cl.
*H10K 59/80* (2023.01)
*H10K 59/124* (2023.01)
*H10K 102/00* (2023.01)

(52) U.S. Cl.
CPC ....... *H10K 59/8731* (2023.02); *H10K 59/124* (2023.02); *H10K 2102/311* (2023.02); *H10K 2102/351* (2023.02)

(58) Field of Classification Search
CPC ............. H10K 59/8731; H10K 59/124; H10K 2102/311; H10K 2102/351; H10K 50/844; H10K 77/111; G90F 9/301
See application file for complete search history.

(56) References Cited

U.S. PATENT DOCUMENTS

| | | | | |
|---|---|---|---|---|
| 9,287,342 | B2 * | 3/2016 | Kwon | H10D 86/441 |
| 10,211,276 | B2 * | 2/2019 | Choi | H10K 77/111 |
| 10,439,017 | B2 * | 10/2019 | Kim | H10D 86/441 |
| 11,417,860 | B2 | 8/2022 | Lee et al. | |
| 11,456,430 | B2 | 9/2022 | Kim | |
| 2016/0043348 | A1 | 2/2016 | Zhang | |
| 2016/0268540 | A1 * | 9/2016 | Kim | H10K 59/131 |
| 2017/0148856 | A1 * | 5/2017 | Choi | H10K 59/873 |
| 2017/0194404 | A1 * | 7/2017 | Park | H10K 59/124 |
| 2022/0029132 | A1 * | 1/2022 | Lee | H10K 59/40 |

FOREIGN PATENT DOCUMENTS

| | | | |
|---|---|---|---|
| KR | 20140032268 | A | 3/2014 |
| KR | 20150109557 | A | 10/2015 |
| KR | 20170080779 | A | 7/2017 |
| KR | 20200051150 | A | 5/2020 |
| KR | 20200059814 | A | 5/2020 |
| KR | 20200124642 | A | 11/2020 |

* cited by examiner

*Primary Examiner* — Dao H Nguyen
(74) *Attorney, Agent, or Firm* — Seed Intellectual Property Law Group LLP

(57) ABSTRACT

A display apparatus according to the present disclosure comprises a display panel including a display area and a non-display area outside the display area, a plurality of fixing units disposed in the non-display area, and wherein the plurality of fixing units is disposed in at least one side of both sides in a stretching direction of the display panel.

22 Claims, 9 Drawing Sheets

DISPLAY APPARATUS FOR PREVENTING DEFECTS DUE TO STRETCHING

CROSS-REFERENCE TO RELATED APPLICATION

This application claims priority to and the benefit of Republic of Korea Patent Application No. 10-2022-0186713, filed on Dec. 28, 2022, the contents of which are incorporated herein by reference in its entirety.

BACKGROUND

Technical Field

The present disclosure relates to a display apparatus that can prevent defects due to stretching.

Description of the Related Art

As information technology develops, various types of small and thin display apparatus such as a Liquid Crystal Display Apparatus an Organic Light Emitting Display Apparatus, a Plasma Display Apparatus, a Micro LED Display Apparatus, etc., are proposed. These display apparatuses are applied to various electronic devices such as smart phones and tablet PCs.

Further, a stretchable display apparatus that can be applied to various electronic products have recently been proposed.

BRIEF SUMMARY

However, the inventors of the present disclosure have recognized that since stretching stress is continuously and repeatedly applied to the stretchable display apparatus when stretched, there is a problem in that the film and encapsulation layer of the display apparatus is stretched or peeled off due to the stretching stress. Various embodiments of the present disclosure address the various technical problems in the related art including the technical problem identified above.

For instance, various embodiments of the present disclosure provide a display apparatus having a fixing unit for preventing the peeling of a thin layer by a stress when stretched, folded, bended, and flexed.

A display apparatus according to one aspect of the present disclosure comprises a substrate including a display area and a non-display area, a buffer layer on the substrate, a plurality of thin film transistors and a plurality of display devices over the buffer layer, and an encapsulation layer over the display device, wherein at least one layer of the buffer layer and the encapsulation layer including a plurality of inorganic layers and a plurality of organic layers, the inorganic layer and the organic layer being alternatively deposited, and wherein the inorganic layer and the organic layer includes a fixing unit for fixing thereof. In one embodiment, the inorganic layer and the organic layer includes a fixing member that affixes the respective layers to the substrate.

The fixing unit includes at least one hole formed in each of the plurality of inorganic layer and an organic material formed inside of the hole to connect the organic layers.

The inorganic layer has a thickness of 15-25 nm and the organic layer has the thickness of 5-15 nm. The hole is formed in one shape of a triangular shape, a square shape, a pentagonal shape, a hexagonal shape, a circular shape, and an oval shape.

The display device is a stretchable display device, the hole is formed in the non-display area and an area of the hole increases from the display area to the non-display area.

The display device includes a foldable display device, a bendable display device, and a flexible display device, at this time the hole may be formed in one of a folding area, a bending area, and a flexing area.

The display apparatus according to another aspect of the present disclosure comprises a display panel including a display area and a non-display area outside the display area, a plurality of fixing units disposed in the non-display area, and wherein the plurality of fixing units are disposed in at least one side of both sides in a stretching direction of the display panel.

The display panel includes a substrate, a plurality of thin film transistors and a plurality of light emitting devices, and an encapsulating layer over the light emitting devices. The encapsulating layer includes a plurality of first encapsulation layers made of a inorganic material and a plurality of second encapsulation layers made of an organic material, the first encapsulation layers and the second encapsulation layers being alternatively deposited, and the fixing unit includes the plurality of first encapsulation layers, the plurality of second encapsulation layers, and at least one hole formed in each of the plurality of first encapsulation layers to connect the plurality of second encapsulation layers.

The display panel includes a substrate, a buffer layer over the substrate, and a plurality of thin film transistors and a plurality of light emitting devices over the substrate. The buffer layer includes a plurality of first buffer layers made of a inorganic material and a plurality of second buffer layers made of an organic material, the first buffer layers and the second buffer layers being alternatively deposited, and the fixing unit includes the plurality of first buffer layers, the plurality of second buffer layers, and at least one hole formed in each of the plurality of first buffer layers to connect the plurality of second buffer layers.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
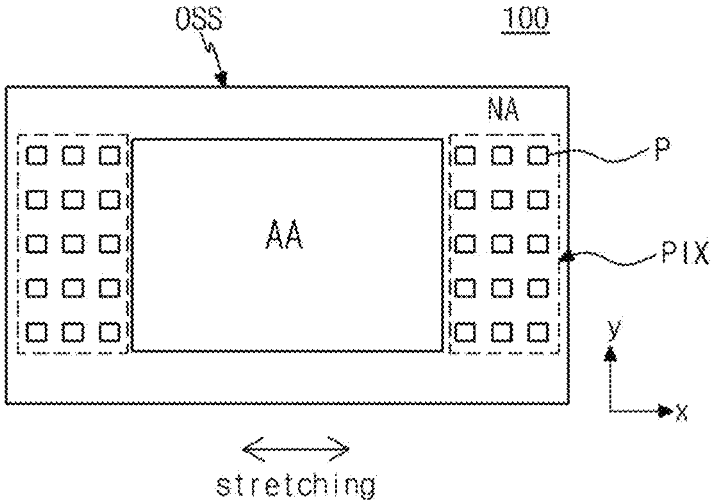
FIGS. 1A and 1B are plan views schematically showing the structure of the display apparatus 100 according to the present disclosure.

Advantages and features of the present disclosure and methods for achieving them will be made clear from embodiments described in detail below with reference to the accompanying drawings. The present disclosure may however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains.

Shapes, sizes, dimensions (e.g., length, width, height, thickness, radius, diameter, area, etc.), ratios, angles, number of elements, and the like disclosed in the drawings for describing the embodiments of the present disclosure are illustrative, and thus the present disclosure is not limited to the illustrated matters.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "consisting of," and the like mentioned in this disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is not used, one or more other parts may be located between the two parts.

In describing a temporal relationship, for example, when a temporal predecessor relationship is described as being "after," "subsequent," "next to," "prior to," or the like, unless "immediately" or "directly" is not used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

In describing the components of the present specification, terms such as first, second, A, B, (a), (b), etc., may be used. These terms are only for distinguishing the elements from other elements, and the essence, order, or number of the elements are not limited by the terms. When it is described that a component is "connected" "coupled" or "connected" to another component, the component may be directly connected or connected to the other component, but indirectly without specifically stated. It should be understood that other components may be "interposed" between each component that is connected or can be connected.

As used herein, the term "apparatus" may include a display apparatus such as a liquid crystal module (LCM) including a display panel and a driving unit for driving the display panel, and an organic light emitting display module (OLED module). Further, the term "apparatus" may further include a notebook computer, a television, a computer monitor, a vehicle electric apparatus including an apparatus for a vehicle or other type of vehicle, and a set electronic apparatus or a set apparatus such as a mobile electronic apparatus of a smartphone or an electronic pad, etc., which are a finished product (complete product or final product) including LCM and OLED module.

Accordingly, the apparatus in the present specification may include the display apparatus itself such as the LCM, the OLED module, etc., and the application product including the LCM, the OLED module, or the like, or the set apparatus, which is the apparatus for end users.

Hereinafter, the present disclosure will be described in detail with reference to the attached drawings.

The present disclosure can be applied to various display apparatus. For example, the present disclosure can be applied to a stretchable display apparatus capable of stretching and contracting, a foldable display apparatus capable of folding, a bendable display apparatus capable of bending some areas, a flexible display apparatus capable of bending, etc. Hereinafter, for convenience of explanation, the stretchable display apparatus will be described as an example.

Figure 1B:
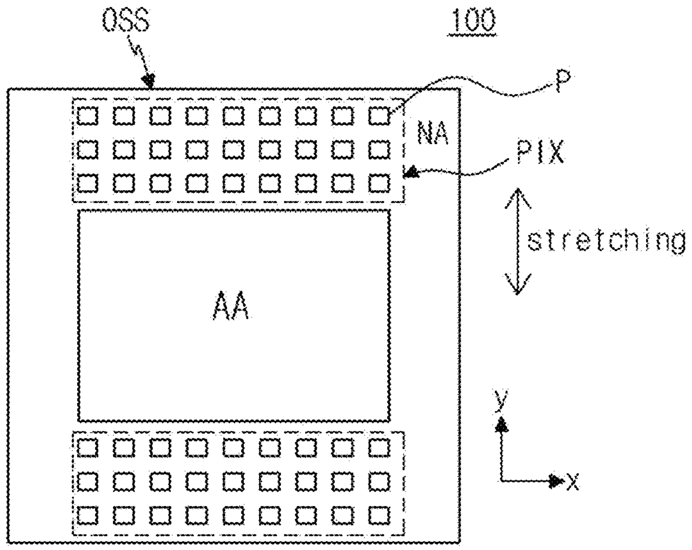

FIGS. 1A and 1B are plan views schematically showing the structure of the display apparatus 100 according to the present disclosure.

As shown in FIGS. 1A and 1B, the display apparatus 100 according to the present disclosure includes a display area AA and a non-display area NA outside the display area (AA). The display area AA is an area where an image is displayed. At least one thin film transistor and various electrodes may be disposed in each of the plurality of sub pixels.

Although not shown in the figures, the display area AA includes a plurality of sub pixels which are defined by gate lines and data lines arranged perpendicular to each other.

If the display apparatus 100 is an organic light emitting display apparatus, an organic light emitting element may be placed in each sub pixel of the display area AA. If the display apparatus 100 is a liquid crystal display apparatus, a liquid crystal layer and an alignment layer may be disposed in each sub pixel of the display area AA. If the display apparatus 100 is an electrophoresis display apparatus, an electrophoresis layer may be placed in each sub pixel of the display area AA. If the display apparatus 100 is a quantum dot display apparatus, a quantum dot layer may be placed in each sub pixel of the display area AA. If the display apparatus 100 is a micro LED display apparatus, a micro LED may be placed in each sub pixel of the display area AA. If the display apparatus 100 is a mini LED display apparatus, a mini LED may be placed in each sub pixel of the display area AA.

Various lines may be disposed in the non-display area NA to supply various signals to the display area AA. For example, the lines for applying driving signals such as a data enable signal, a vertical synchronization signal, a horizontal synchronization signal, and a clock signal, power lines for supplying power signal such as a high potential voltage VDD and a low potential voltage VSS, data link lines for applying data signals, and gate link lines for supplying scan signals, etc., may be disposed in the non-display area NA.

A gate driving unit may be disposed in the non-display area NA in at least one of the left and right sides of the display area AA. The gate driving unit applies the scan signal to the gate line through the gate link line in response to a gate timing control signal supplied from the external timing control unit. The gate driving unit may be an integrated circuit (IC) mounted on the non-display area NA or a gate in panel (GIP) including a thin film transistor directly deposited in the non-display area NA.

A fixing unit PIX is formed in the non-display area NA. As shown in FIG. 1A or FIG. 1B, the fixing unit PIX is between the display area AA and an outermost side OSS of the display panel PNL (or a substrate 140). The outermost side OSS of the display panel PNL may be referred to as the outermost periphery of the display panel PNL. When the display panel PNL is stretched, the fixing unit PIX fixes the thin layer formed in the display apparatus 100 to prevent the thin film from being peeled off or lifted. Therefore, the fixing unit PIX can be applied to various thin layers inside the display apparatus 100.

As shown in FIGS. 1A and 1B, the stretchable display apparatus 100 can be stretched in a horizontal direction (x-direction) and a vertical direction (y-direction), respectively. When the display apparatus 100 is stretched in the horizontal direction (x-direction) as shown in FIG. 1A, the fixing unit PIX may be disposed in the non-display area NA disposed in the stretching direction, that is, in the non-display area NA at the left and right sides of the display area AA. Further, when the display apparatus 100 is stretched in the vertical direction (y-direction) as shown in FIG. 1B, the fixing unit PIX may be disposed in the non-display area NA disposed in the stretching direction, that is, in the non-display area NA at the upper portion and the lower portion of the display area AA.

The fixing unit PIX includes a plurality of fixing members P. A plurality of fixing members P are arranged in rows and columns along the horizontal and vertical directions, and each fixing member P is spaced a certain distance away from the adjacent fixing member P. That is, the plurality of fixing members P are arranged in rows and columns of n×m (where n and m are natural numbers). At this time, the fixing members P are not arranged in a specific number of rows and columns. The rows and columns of the fixing member P are determined by the type of thin layer to which the fixing member P is applied, the size of the fixing member P, the area of the non-display area NA, and the gap between adjacent fixing units PIX, etc.

The fixing member P may be a hole H (see FIG. 6) formed in an insulating layer disposed in the non-display area NA, but is not limited thereto.

Although the fixing member P is formed in a square shape in the drawing, the fixing member P is not limited to this shape and may be formed in various shapes. For example, the fixing member P may be formed in a polygonal shape such as a triangle, pentagon, or hexagon, or may be formed in a circular or oval shape.

The plurality of fixing members P may be formed in a single shape, but may also be formed in different shapes depending on their positions. For example, the fixing member P may be formed in a hexagonal or circular shape in the region where the stress is the strongest, and the fixing member P may be formed in a triangular shape in the region where stress is the weakest.

Figure 2A:
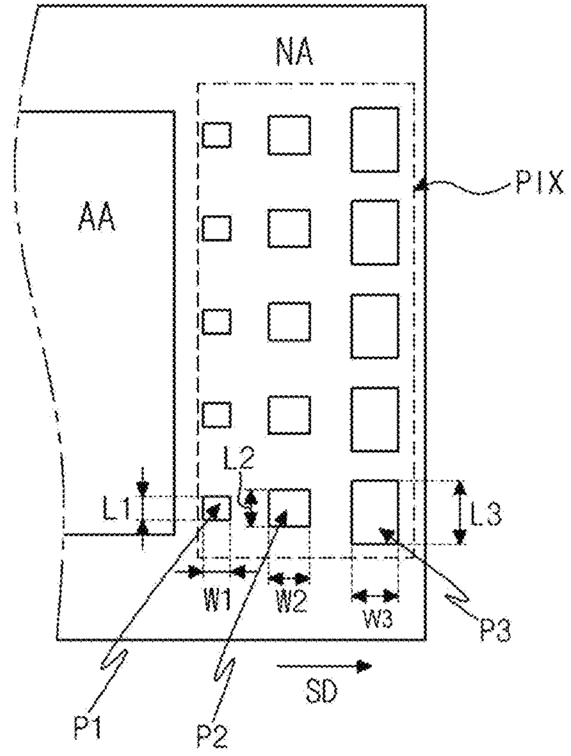
FIGS. 2A and 2B are diagrams showing that the area of the fixing unit varies depending on the position.
Figure 2B:
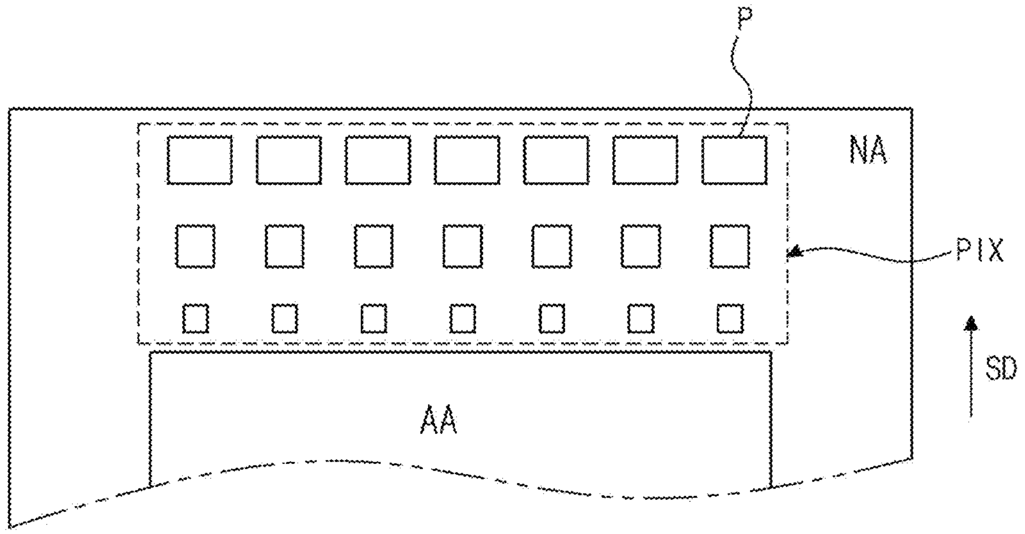

The fixing members P formed at different positions may have different areas. Since the adhesion of the corresponding thin layer increases as the area of the fixing member P increases, the area of the fixing member P formed in the region where the stress is the strongest is increased or maximized and the area of the fixing member P formed in the region where the stress is the weakest is reduced or minimized. As shown in FIGS. 2A and 2B, the area of the fixing member P formed in the outermost side OSS in the stretching direction SD, for example, in the outermost side OSS of the left and right sides of the non-display area NA (see FIG. 2A) or in the outermost side OSS of the upper and lower sides of the non-display area NA (see FIG. 2B), may be increased or maximized, and the area of the fixing member P can be reduced or minimized as move toward the display area AA. In particular, referring to FIG. 2A, a fixing member P1 may have a width W1 and a length L1, a fixing member P2 may have a width W2 and a length L2, and a fixing member P3 may have a width W3 and a length L3. The fixing member P1 is closest to the display area AA among the plurality of fixing members P shown in FIG. 2A. The fixing member P3 is farthest from the display area AA and it is closes to the outermost side OSS (or outermost side surface OSS) of the display (or display panel). As the stretchable display apparatus 100 is stretched in direction SD, the area of the fixing member is gradually increased. For instance, the width W3 of the fixing member P3 is greater than the width W2 of the fixing member P2. Similarly, the width W2 of the fixing member P2 is greater than the width W1 of the fixing member P1. The same is true for the length of the fixing member. For instance, the length L3 of the fixing member P3 is greater than the length L2 of the fixing member P2. Similarly, the length L2 of the fixing member P2 is greater than length L1 of the fixing member P1.

Figure 3A:
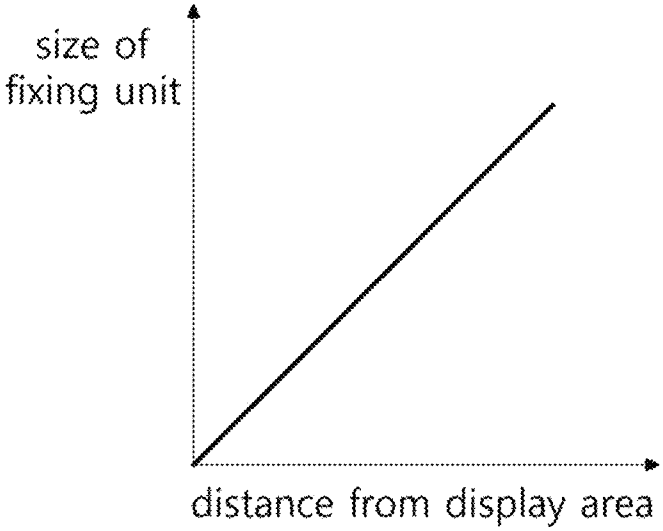
FIGS. 3A and 3B are graphs showing the relationship of the distance between the display area and the fixing unit and the size of the fixing unit.
Figure 3B:
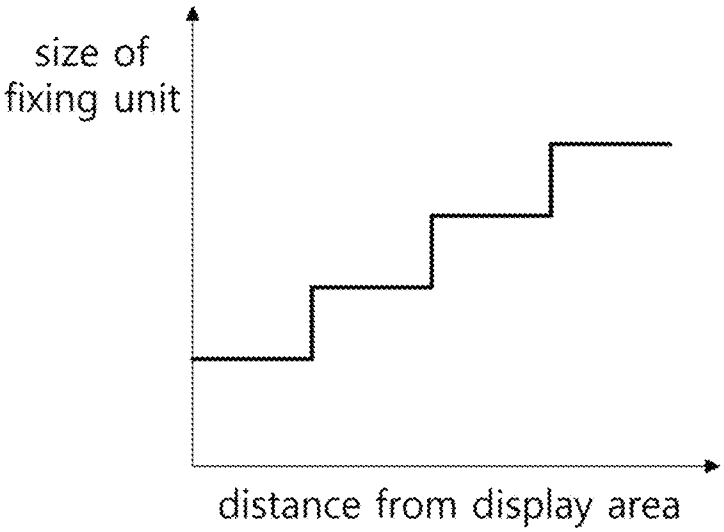

At this time, as shown in FIG. 3A, the area of the fixing member P increases continuously as moves from the display area AA to the outer end (or outermost side) OSS of the display apparatus 100 as the distance from the display area AA increases. On the other hand, in some embodiments, as shown in FIG. 3B, the area of the fixing member P may increase stepwise as the distance from the display area AA increases.

Figure 4A:
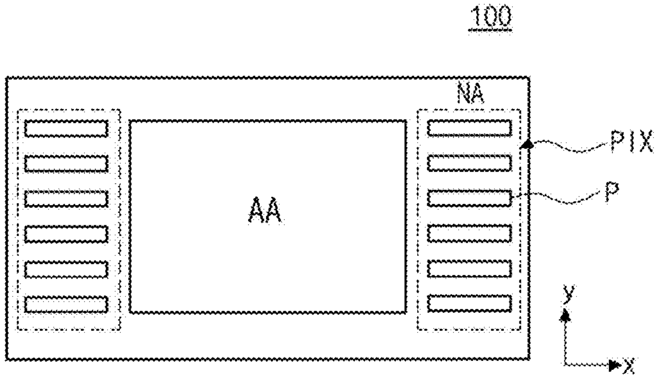
FIGS. 4A and 4B are plan views schematically showing another structure of the display apparatus according to the present disclosure.
Figure 4B:
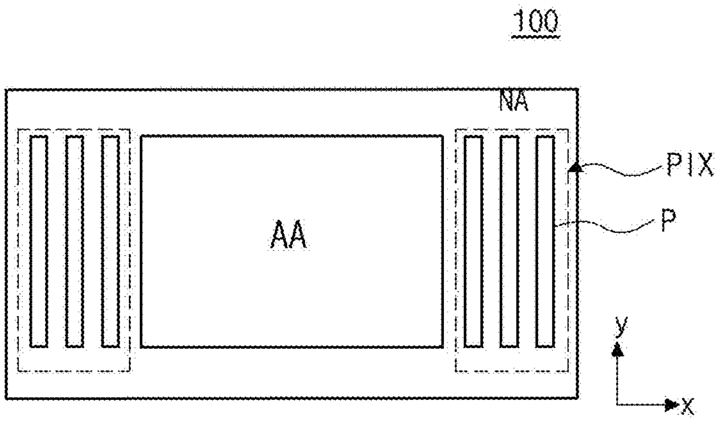

FIGS. 4A and 4B are plan views schematically showing another structure of the display apparatus 100 according to the present disclosure. As shown in FIGS. 4A and 4B, in this display apparatus 100, each of the fixing members P in the fixing unit PIX is formed in narrow rectangle shape, or bar shape, or strip shape extending in the x-direction (see FIG. 4A) or y-direction (see FIG. 4B), the plurality of fixing members P may be arranged in the y-direction or x-direction.

On the other hand, in some embodiments, the fixing unit PIX may also be formed in the display area AA. The stress is mainly concentrated in the non-display area (NA) in a stretchable display apparatus, but the stress is not concentrated in the non-display area NA but rather in various areas in the foldable display apparatus, the bendable display apparatus, or the flexible display apparatus. For example, the stress is concentrated in the folding area in the foldable display apparatus, the stress is concentrated in the bending area in the bendable display apparatus, and the stress is concentrated in the flexing area in the flexible display apparatus. Therefore, the fixing unit PIX is disposed in the folding area in the foldable display apparatus, the fixing unit PIX is disposed in the bending area in the bendable display apparatus, and the fixing unit PIX is disposed in the flexing area in the flexible display apparatus.

Accordingly, in the display apparatus 100 according to the present disclosure, the fixing unit PIX may not be disposed only at a specific region, but may be disposed in various region depending on the structure or size of the display apparatus 100.

Hereinafter, the structure of the display apparatus 100 according to the present disclosure will be described in more detail with reference to the attached drawings. The present disclosure can be applied to various display apparatus such as the organic light emitting display apparatus, the liquid crystal display apparatus, the quantum dot display apparatus, the micro LED display apparatus, and the mini LED display apparatus. However, for convenience of explanation, the organic light emitting display apparatus will be described as an example.

Figure 5:
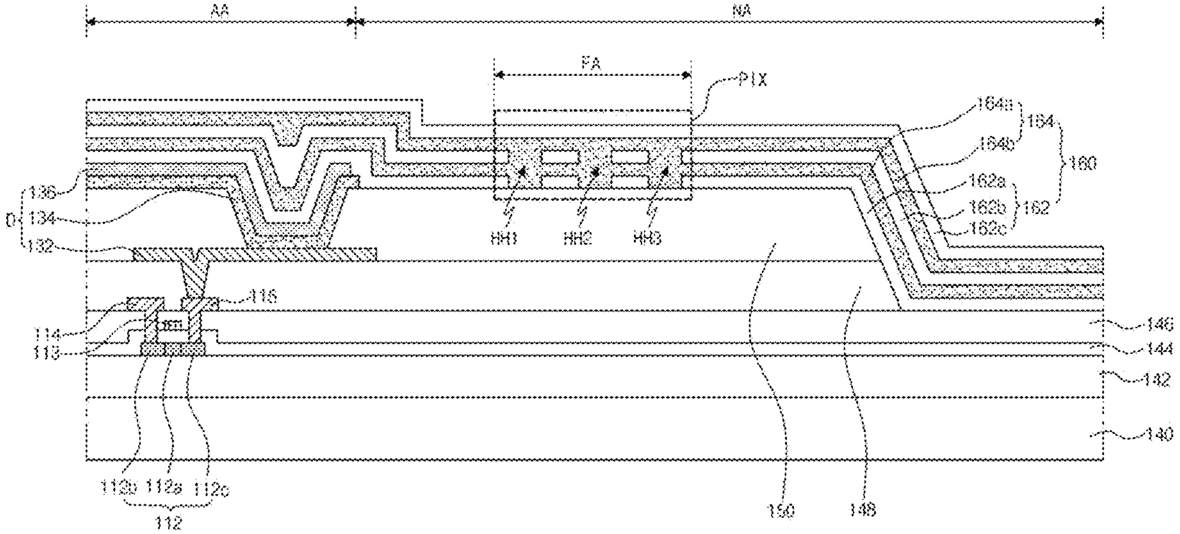
FIG. 5 is a cross-sectional view showing the structure of the display apparatus according to the first embodiment of the present disclosure.
Figure 6:
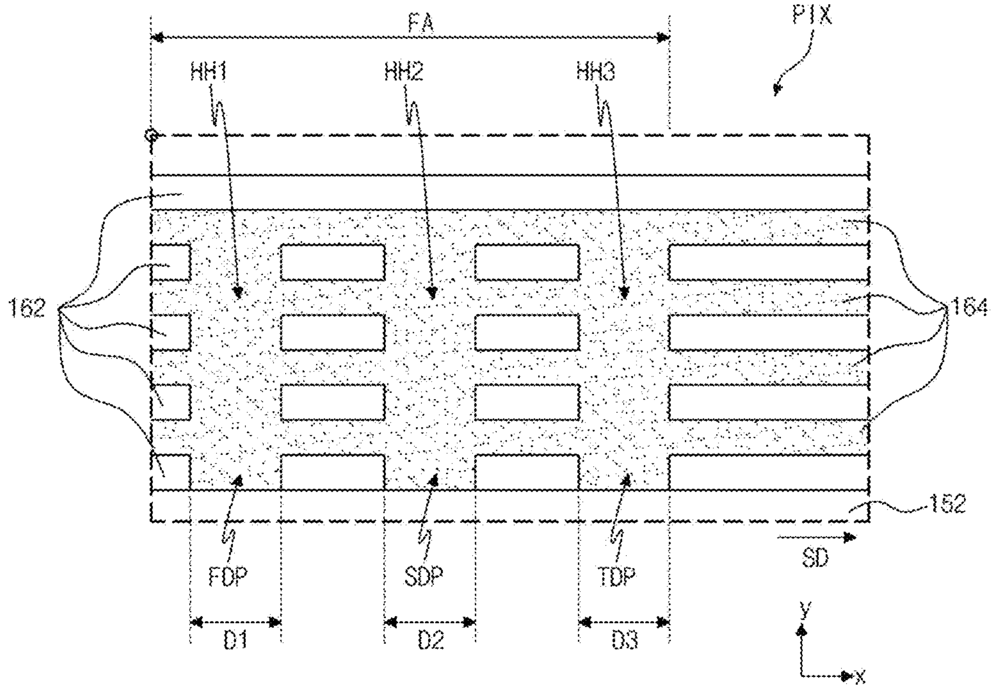
FIG. 6 is an enlarged cross-sectional view of the structure of the fixing unit PIX of the FIG. 5.

FIG. 5 is a cross-sectional view showing the structure of the display apparatus 100 according to the first embodiment of the present disclosure and FIG. 6 is an enlarged cross-sectional view of the fixing unit PIX of the FIG. 5. At this time, the display apparatus 100 is the stretchable display apparatus, but the display apparatus 100 can be the foldable display apparatus, the bendable display apparatus, the flexible display apparatus, etc.

As shown in FIGS. 5 and 6, a buffer layer 142 is formed on a substrate 140. The substrate 142 may be made of a plastic material such as include a polyimide, a polymethylmethacrylate, a polyethylene tereththalate, a Polyethersulfone, and a Polycarbonate, but is not limited thereto.

When the substrate 140 is made of polyimide, for example, the substrate 140 may be made of a plurality of polyimide layers, and an inorganic layer may be further disposed between the polyimide layers, but is not limited thereto.

The buffer layer 142 may be formed in the entire area of the substrate 140 to enhance adhering force between the substrate 140 and the layers thereon. Further, the buffer layer 142 may block various types of defects, such as alkali components flowing out from the substrate 140. Further, the first buffer layer 142 may delay diffusion of moisture or oxygen penetrating into the substrate 140.

The buffer layer 142 may be a single layer made of silicon oxide (SiOx) or silicon nitride (SiNx), or multi-layers thereof. When the buffer layer 142 is made of multiple layers, SiOx and SiNx may be alternately formed. The buffer layer 142 may be omitted based on the type and material of the substrate 140, the structure and type of the thin film transistor, and the like. In one embodiment, the buffer layer 142 is an insulation layer.

A thin film transistor is formed on the buffer layer 142 in the display area AA. For convenience of description, only the driving thin film transistor among various thin film transistors that may be disposed in the R, G, B sub-pixels is illustrated, but other thin film transistors such as switching thin film transistors may also be included. In the figure, the thin film transistor of a top gate structure is shown, but the thin film transistor is not limited to this structure and may be formed in other structures such as the thin film transistor of a bottom gate structure.

The thin film transistor includes a semiconductor pattern 112 disposed on the buffer layer 142, a gate insulating layer 144 covering the semiconductor pattern 112, a gate electrode 113 on the gate insulating layer 144, an interlayer insulating layer 146 covering the gate electrode 113, and a source electrode 114 and a drain electrode 115 on the interlayer insulating layer 146.

The semiconductor pattern 112 may be made of a polycrystalline semiconductor. For example, the polycrystalline semiconductor may be made of low temperature poly silicon (LTPS) having high mobility, but is not limited thereto.

The semiconductor pattern 112 may be made of an oxide semiconductor. For example, semiconductor pattern 112 may be made of one of IGZO (Indium-gallium-zinc-oxide), IZO (Indium-zinc-oxide), IGTO (Indium-gallium-tin-oxide), and IGO (Indium-gallium-oxide), but is not limited thereto. The semiconductor pattern 112 includes a channel region 112*a* in a central region and a source region 112*b* and a drain region 112*c* which are doped layers at both sides of the channel region 112*a*.

The gate insulating layer 144 may be formed in the display area AA and the non-display area NA or formed only in the display area AA. The gate insulating layer 144 may be composed of a single layer or multiple layers made of an inorganic material such as SiOx or SiNx, but is not limited thereto.

The gate electrode 113 is made of a metal. For example, the gate electrode 113 may be formed of the single layer or multi layers made of one or alloys of molybdenum (Mo), aluminum (Al), chromium (Cr), gold (Au), titanium (Ti), nickel (Ni), neodymium (Nd), and copper (Cu), but is not limited thereto.

The interlayer insulating layer 146 may be formed in the display area AA and the non-display area NA or formed only in the display area AA. The interlayer insulating layer 146 may be made of the organic material such as photo-acryl, or the interlayer insulating layer 146 may formed of the single layer or the multiple layers made of the inorganic material such as SiOx or SiNx, but is not limited thereto. Further, the interlayer insulating layer 146 may be formed of the multi layers of the organic material layer and the inorganic material layer, but is not limited thereto.

The source electrode 114 and the drain electrode 115 are formed of the single layer or multi layers made of one or alloys of molybdenum (Mo), aluminum (Al), chromium (Cr), gold (Au), titanium (Ti), nickel (Ni), neodymium (Nd), and copper (Cu), but is not limited thereto. The source electrode 114 and the drain electrode 115 may be respectively contacted to the source region 112*b* and the drain region 112*c* of the semiconductor through contact holes formed in the gate insulating layer 144 and the interlayer insulating layer 146.

Not shown in figure, a bottom shield metal layer may be disposed on the substrate 140 under the semiconductor pattern 112. The bottom shield metal layer minimizes a backchannel phenomenon caused by charges trapped in the substrate 140 to prevent afterimages or deterioration of transistor performance. The bottom shield metal layer may be composed of the single layer or the multi layers made of titanium (Ti), molybdenum (Mo), or an alloy thereof, but is not limited thereto.

A planarization layer 148 is formed on the substrate 140 where the thin film transistor is disposed. The planarization layer 148 may be formed in the display area AA and the non-display area NA. Further, the planarization layer 148 may be formed only in the display area AA. The planarization layer 148 may be formed of the organic material such as photo acrylic. But it is not limited thereto. The planarization layer 148 may include a plurality of layers including the inorganic layer and the organic layer.

An organic light emitting element D is disposed on the planarization layer 148. The organic light emitting element D includes a first electrode 132, an organic layer 134, and a second electrode 136.

The first electrode 132 is disposed on the planarization layer 148 and electrically connected to the drain electrode 115 of the thin film transistor T through the contact hole formed in the planarization layer 148 so that an image signal is applied to the first electrode from outside. The first electrode 132 may be formed of at least one of silver (Ag), aluminum (Al), gold (Au), molybdenum (Mo), tungsten (W), chromium (Cr), or an alloy thereof. In addition, the first electrode 132 is formed of the transparent metal oxide material such as ITO (Indium Tin Oxide) and IZO (Indium Zinc Oxide).

When the display apparatus 100 is a top emission type display apparatus, the first electrode 132 may be a reflective electrode made of an opaque conductive material. When the display apparatus 100 is a bottom emission type display apparatus, the first electrode 132 may be made of a transparent conductive material such as ITO or IZO.

A bank layer 150 is formed at the boundary of each sub-pixel on the second insulating layer 150. The bank layer 150 partitions each sub-pixel to prevent mixing of light of a specific color output from adjacent pixels.

The bank layer 150 is made of at least one material of inorganic insulating material such as SiNx or SiOx, the organic insulating material such as BenzoCycloButene, acrylic resin, epoxy resin, phenolic resin, polyamide resin, or the photosensitizer including black pigment, but is not limited thereto.

The organic layer 134 is formed on the upper surface of the first electrode 132, the inclined surface of the bank layer 150, or the partial region of the upper surface of the bank layer 150. The organic layer 134 is formed in the R, G, and B sub-pixels and may include an R-emitting layer for emitting red light, a G-emitting layer for emitting green light, and a B-emitting layer for emitting blue light. Further, the organic layer 134 may include a W-emitting layer for emitting white light. For example, the organic layer 134 may include an organic light emitting layer. Further, the organic layer 134 may be replaced with a nano-sized material layer, a quantum dot layer, a micro, but is not limited thereto.

The organic layer 134 may further include an electron injecting layer for injecting electrons into the light emitting layer, a hole injecting layer for injecting holes into the light emitting layer, an electron transporting layer for transporting the injected electrons to the light emitting layer, a hole transporting layer for transporting the injected holes to the light emitting layer, an electron blocking layer, and a hole blocking layer, but is not limited thereto.

The second electrode 136 is disposed on the organic layer 134 and may be formed of the single layer or the multi layers made of the metal or the alloy thereof. Further, the second electrode 136 may be made of a transparent metal oxide material such as ITO or IZO, but is not limited thereto.

When the display apparatus 100 is the top emission type, the second electrode 136 may be made of the translucent conductive material that transmits light. For example, the second electrode 136 may be made of at least one or more of the alloys such as LiF/Al, CsF/Al, Mg:Ag, Ca/Ag, Ca:Ag, LiF/Mg:Ag, LiF/Ca/Ag, or LiF/Ca:Ag.

When the display apparatus 100 is the bottom emission type, the second electrode 136 may be the reflective electrode made of the opaque conductive material. For example, the second electrode 136 may be made of at least one or more of silver (Ag), aluminum (Al), gold (Au), molybdenum (Mo), tungsten (W), chromium (Cr), or alloys thereof.

Further, the organic light emitting element D may be formed in a tandem structure. The tandem structure may include a plurality of organic light emitting layers and a charge generating layer disposed between the organic light emitting layers. The charge generating layer is disposed to adjust the charge balance between the plurality of organic light emitting layers, and may be formed of a plurality of layers including a first charge generating layer and a second charge generating layer. The charge generating layer may include an N-type charge generating layer and a P-type charge generating layer. In this case, the charge generating layer may be formed of the organic layer doped with an alkali metal such as Li, Na, K, or Cs or an alkaline earth metal such as Mg, Sr, Ba, or Ra, but is not limited thereto.

An encapsulation layer 160 is formed on the organic light emitting element (D). In one embodiment, the encapsulation layer 160 is an insulation layer. The encapsulation layer 160 includes a plurality of first encapsulation layers 162 made of the inorganic material and a plurality of second encapsulation layers 164 made of the organic material. The first encapsulation layers 162 and the second encapsulation layers 164 are arranged alternately, but the first encapsulation layers 162 are disposed on the lowest and uppermost layers of the encapsulation layer 160.

In the figure, the first encapsulation layer 162 is composed of three layers and the second encapsulation layer 164 is composed of two layers. However, this is for convenience of explanation. In the actual display apparatus, the first encapsulation layer 162 and the second encapsulation layer 164, which are composed of tens to hundreds of layers, are alternately deposited.

By forming each of the first encapsulation layer 162 and the second encapsulation layer 164 in tens to hundreds of layers, the concentration of stress can be prevented and the damage due to cracks can be prevented.

When the display apparatus having softness such as the stretchable display apparatus, the foldable display apparatus, the bendable display apparatus, and the flexible display apparatus is stretched, folded, bent, and curved, the stress is concentrated to the specific area of the encapsulation layer 160, and the defects such as cracks occur in the encapsulation layer 160 due to this concentration of the stress.

However, as in the present disclosure, when the first encapsulation layer 162 and the second encapsulation layer 164 are formed of tens to hundreds of layers, the stress applied to the encapsulation layer 160 is dispersed to tens or hundreds of layers, so that it the defects caused by stress can be prevented.

The first encapsulation layer 162 may be made of the inorganic material such as SiOx or SiNx, but is not limited thereto. The second encapsulation layer 164 may be made of the organic insulating material such as acrylic resin, epoxy resin, polyimide, polyethylene, or silicon oxycarbon (SiOC), but is not limited thereto.

The first encapsulation layer 162 made of the inorganic material blocks moisture and oxygen, and the second encapsulation layer 164 made of the organic material flattens the surface and prevents cracks in the encapsulation layer 160 due to external forces.

Each of the plurality of first encapsulation layers 162 has a thickness of several tens of Å to several tens of nm, preferably 15-25 nm, and each of the plurality of second encapsulation layers 164 has the thickness of several tens of Å to several tens of nm, preferably 5-15 nm, but is not limited thereto.

The fixing unit PIX is formed in the encapsulation layer 160 of the non-display area NA. However, the fixing unit PIX may be formed not only in the non-display area NA but also in the display area AA.

In FIG. 5, the fixing unit PIX is located in a first area FA in the non-display area NA. The fixing unit PIX is formed in the plurality of first encapsulation layer 162 and the plurality of second encapsulation layer 164. At least one hole H is formed in each of the plurality of first encapsulation layer and the hole H is filled with the second encapsulation layer 164. That is, the fixing unit PIX may include the plurality of first encapsulation layers 162, the plurality of second encapsulation layers 164, the plurality of holes H formed in the plurality of first encapsulation layers 162, and the second encapsulation layers 164 filled in the plurality of holes H.

As shown, at least one layer of the plurality of first encapsulation layers 162 (e.g., layers 162*a* and layers 162*b*), is disconnected at the first area FA in the non-display area NA and the plurality of second encapsulation layers 164 is connected at the first area FA. Namely, holes HH1, HH2 and HH3 are present, providing a section of disconnection. In some embodiments, the plurality of second encapsulation layers 164 is continuously and contiguously connected at the first area FA by filling the plurality of holes H in the first area FA with the same material (see FIGS. 6, 7D, 7E, and 7F). That is, the second encapsulation layers 164 (or 264 for FIG. 8) are present in the holes HH1, HH2, HH3 and are filled in the section of disconnection.

At this time, the lowest second encapsulation layer 164 among the plurality of second encapsulation layers 164 contacts the bank layer 150 through the hole H. Since the second encapsulation layer 164 and the bank layer 150 have similar physical properties, the adhesion of the second encapsulation layer 164 improves as the second encapsulation layer 164 and the bank layer 150 are contacted to each other.

The plurality of second encapsulation layers 164 are entirely connected through the plurality of holes H formed in the plurality of first encapsulation layers 162. Since the first encapsulation layer 162 and the second encapsulation layer 164 are made of different materials, the adhesion at the interface is poor. However, the plurality of second encapsulation layers connected through a plurality of holes formed in the first encapsulation layer 162 are made of the same material, so that the adhesion at the interface is better compared to the case where different materials are used.

Accordingly, since the adhesion of the second encapsulation layers 164 in the fixing unit PIX is improved compared to other areas, the encapsulation layer 160 to be stretching is fixed by the fixing unit PIX when the display apparatus 100 is stretched. As a result, it is possible to prevent the peeling of the encapsulation layer 160 due to the stretching.

The hole H can be formed in various shapes. For example, the hole H may be formed in the polygonal shape such as triangle, square, pentagon, or hexagon, or in the circular or oval shape. At this time, all holes H may be formed in the same shape or may be formed in different shapes.

Further, the hole H may be formed in various sizes. For example, all holes H may be formed of the same size or may be formed of different sizes depending on their positions. In case of the stretchable display apparatus 100, the stretchable stress applied to the outmost hole H is largest, so that the size of outmost hole H is largest to maximize the adhesion at this area and the size of the hole H can be decreased as moves toward the display area AA.

Referring to FIGS. 5 and 6, a first hole HH1 may have a first dimension D1 in the x-direction, a second hole HH2 may have a second dimension D2 in the x-direction, and a third hole HH3 may have a third dimension D1 in the x-direction. When the display apparatus 100 is not stretched, the first dimension D1, the second dimension D2, and the third dimension D3 may be identical to each other. However, when the display apparatus 100 is stretched in the stretching direction SD, the third dimension D3 may be greater than the second dimension D2, and second dimension D2 may be greater than the first dimension D1.

As shown, the plurality of first encapsulation layers 162 is disconnected at at least one portion in the first area FA. For example, the disconnected portion includes a first disconnected portion FDP, a second disconnected portion SDP, a third disconnected portion SDP. Here, for instance, the first hole HH1 is defined by the first disconnected portion FDP, the second hole HH2 is defined by the second disconnected portion SDP, and the third hole HH3 is defined by the third disconnected portion TDP. In other words, the first hole HH1 includes the first disconnected portion FDP, the second hole HH2 includes the second disconnected portion SDP, and the third hole HH3 includes the third disconnected portion TDP. The first disconnected portion FDP has a first dimension D1 in the x-axis direction. The second disconnected portion SDP has a second dimension D2 in the x-axis direction. The third disconnected portion TDP has a third dimension D3 in the x-axis direction. It can also be said that the first hole HH1 has a first dimension D1 in the x-axis direction, the second hole HH2 has a second dimension D2 in the x-axis direction, and the third hole HH3 has a third dimension D3 in the x-axis direction.

As previously described in connection with FIGS. 1A, 1B, 2A, and 2B, when the display apparatus is stretched in a stretching direction SD (e.g., the x-axis direction is the stretching direction in FIG. 1A whereas the y-axis direction is the stretching direction in FIG. 1B), a dimension D1, D2, D3 of the first, second, third holes, respectively, gradually increases as the display apparatus is stretched.

Since the third hole HH3 is closest to the outermost side surface OSS of the substrate and the first hole HH1 is closest to the display area AA, the dimension D1 of the first hole is smaller than the dimension D2 of the second hole when the display apparatus is stretched, and the dimension D2 of the second hole is smaller than the dimension D3 of the third hole when the display apparatus is stretched.

In some embodiments, the holes extend through at least one of the plurality of first encapsulation layers (see FIG. 5, layer 162*a*, 162*b*). In some embodiments, the holes extend through at least one of the plurality of first buffer layers (see FIG. 8, layer 242*a*, 242*b*).

The display apparatus 100 according to the present disclosure can achieve the following effects.

First, in the present disclosure, the encapsulation layer 160 includes the plurality of first encapsulation layers 162 made of the inorganic material with a thickness of several tens of Å to several tens of nm and the plurality of second encapsulation layers made of the organic material with a thickness of several tens of Å to several tens of nm 162 are arranged alternately. Therefore, since the stress applied to the specific area is dispersed when the display apparatus 100 is stretched, folded, bent, and curved, it is possible to prevent defects such as cracks due to the stress in the encapsulation layer 160.

Second, in the present disclosure, at least one hole H is formed in each of the plurality of first encapsulation layers 162 of the fixing unit PIX, and the inside of the hole H is filled with the second encapsulation layer 164, so that the plurality of encapsulation layers 162 stacked vertically up and down are integrally connected. Accordingly, the adhesion of the encapsulation layer 160 at the fixing unit PIX is improved, so that the encapsulation layer 160 is reliably fixed when the display apparatus 100 is stretched, folded, bent, or curved.

Third, since the present disclosure does not require structures such as dams in the non-display area NA, the structure and manufacturing process are simplified, thereby reducing manufacturing costs.

In conventional display apparatus, the encapsulation layer includes two inorganic encapsulation layers and one organic encapsulation layer therebetween. At this time, the organic material is dropped into the specific area and then spreads outward to form the organic encapsulation layer with the thickness of several tens of micrometers. Therefore, when coating the organic material to form the organic encapsulation layer, a dam must be formed at the outermost part of the non-display area to prevent the organic material from spreading and flowing out of the display apparatus.

However, in the present disclosure, the plurality of second encapsulation layers 164 are formed to the thickness of tens of Å to tens of nm by an evaporation process, so that the organic materials is not flowed out, and therefore the separate dam is not necessary.

Hereinafter, a method of manufacturing the display apparatus 100 according to the first embodiment of the present disclosure will be described with reference to the attached drawings.

FIGS. 7A to 7F are views showing the method of manufacturing the display apparatus 100 according to the first embodiment of the present disclosure.

Figure 7A:
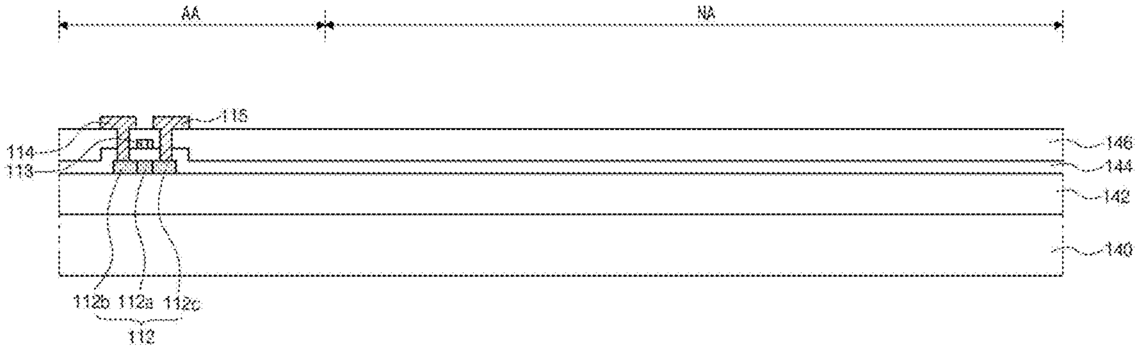
FIGS. 7A to 7F are views showing the method of manufacturing the display apparatus according to the first embodiment of the present disclosure.

As shown in FIG. 7A, the buffer layer 142 including single layer made of silicon oxide (SiOx) or silicon nitride (SiNx), or multi-layers thereof is formed on the entire area of the substrate 140 having the display area AA and the non-display area NA which is made of the plastic material such as the plastic material may include a polyimide, a polymethylmethacrylate, a polyethylene tereththalate, a Polyethersulfone, and a Polycarbonate.

Thereafter, the poly-crystalline semiconductor material such as polysilicon or the oxide semiconductor material such as IGZO (Indium-gallium-zinc-oxide), IZO (Indium-zinc-oxide), IGTO (Indium-gallium-tin-oxide), and IGO (Indium-gallium-oxide) is deposed and etched to form the semiconductor layer on the buffer layer 142. Further, the impurities are doped into the both sides of the semiconductor layer 112 to form the channel region 112*a*, the source region 112*b*, and the drain region 112*c*.

Subsequently, the gate insulating layer is formed 144 by depositing the inorganic material such as SiOx or SiNx, and then the metal such as molybdenum (Mo), aluminum (Al), chromium (Cr), gold (Au), titanium (Ti), nickel (Ni), Neodymium (Nd) and copper (Cu) are deposited by the sputtering method and etched by the wet etching method to form the gate electrode 113. Thereafter, the organic material such as photo acrylic material or the inorganic material such as SiNx or SiOx is deposited on the gate electrode 113 to form the interlayer insulating layer 146, and then the interlayer insulating layer 146 over the source region 112*b* and the drain region 112*c* of the semiconductor layer 112 is dry-etched to form the contact holes therein.

Subsequently, the metal such as Cr, Mo, Ta, Cu, Ti, Al, or an Al alloy is deposited by the sputtering method and etched to form the source electrode 114 and the drain electrode 115 which are respectively ohmic-contacted to the source region 112*b* and the drain region 112*c* of the semiconductor layer 112 through the contact holes.

Figure 7B:
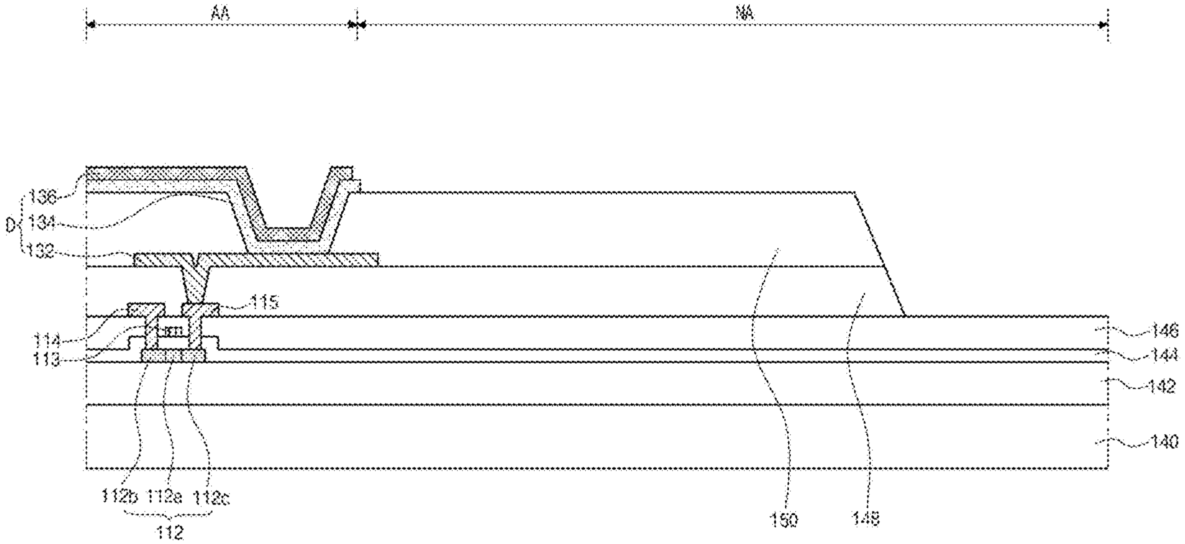

As shown in FIG. 7B, thereafter, the planarization layer 148 is formed by depositing the organic material such as photo-acryl on the source electrode 114 and the drain electrode 115, and then the planarization layer 148 on the drain electrode 115 is dry-etched to form the contact hole.

Thereafter, the metal or the metal oxide is deposited on the planarization layer 148 by the sputtering method and etched by the wet etching method to form the first electrode 132 electrically connected to the drain electrode 115 through the contact hole, and then at least one material of the inorganic insulating material such as SiNx or SiOx, the organic material such as BCB (BenzoCycloButene), acrylic resin, epoxy resin, phenolic resin, polyamide resin, and polyimide resin, and the photoresist including the black pigment is deposited on the planarization layer 148 and the first electrode 132 and dry-etched to form the bank layer 150.

Subsequently, the organic light emitting material is coated on the bank layer 150 and the first electrode 132 to form the organic layer 134 and the second electrode 136 in order to form the organic light emitting element D.

Figure 7C:
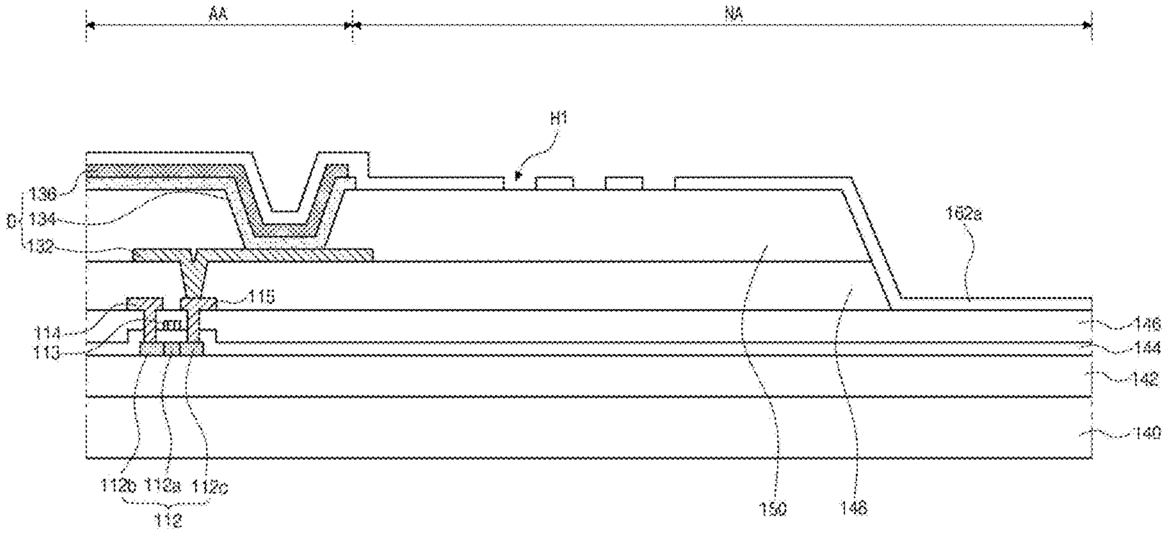

Thereafter, as shown in FIG. 7C, the inorganic material such as SiOx or SiNx is deposited on the organic light emitting element D and the bank layer 150 by the deposition method such as a CVD (Chemical Vapor Deposition) method to form a (1-1)th encapsulation layer 162*a* and a portion of the (1-1)th encapsulation layer 162*a* is etched in the non-display area NA to form at least one first hole H1.

Figure 7D:
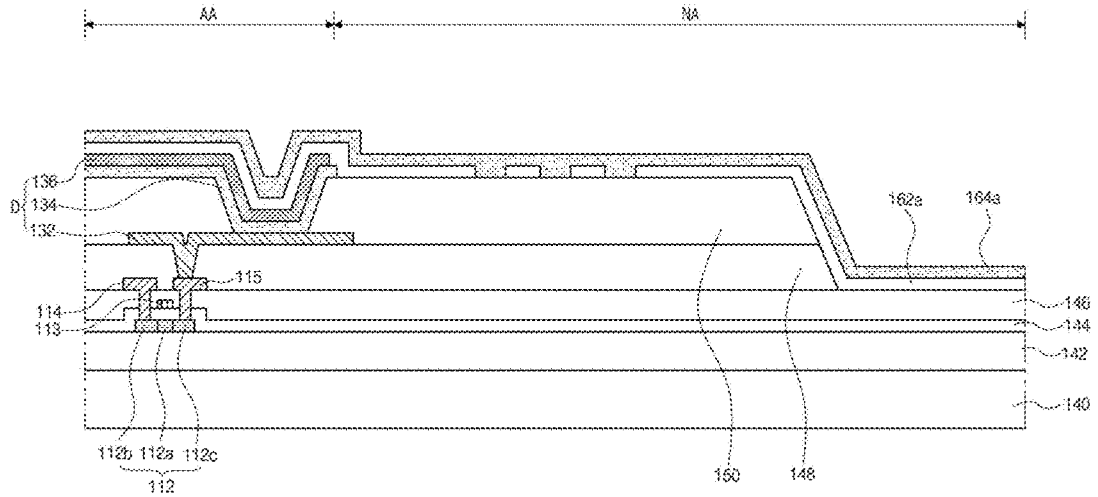

Subsequently, as shown in FIG. 7D, the organic insulating material such as acrylic resin, epoxy resin, polyimide, polyethylene, or silicon oxycarbon (SiOC) is deposited on the (1-1)th encapsulation layer 162*a* to form a (2-1)th encapsulation layer 164*a*. At this time, the (2-1)th encapsulation layer 164*a* is also formed inside the first hole H1 in the (1-1)th encapsulation layer 162*a* so that the (2-1)th encapsulation layer 164*a* is directly contacted with the bank layer 150 through the first hole H1.

Figure 7E:
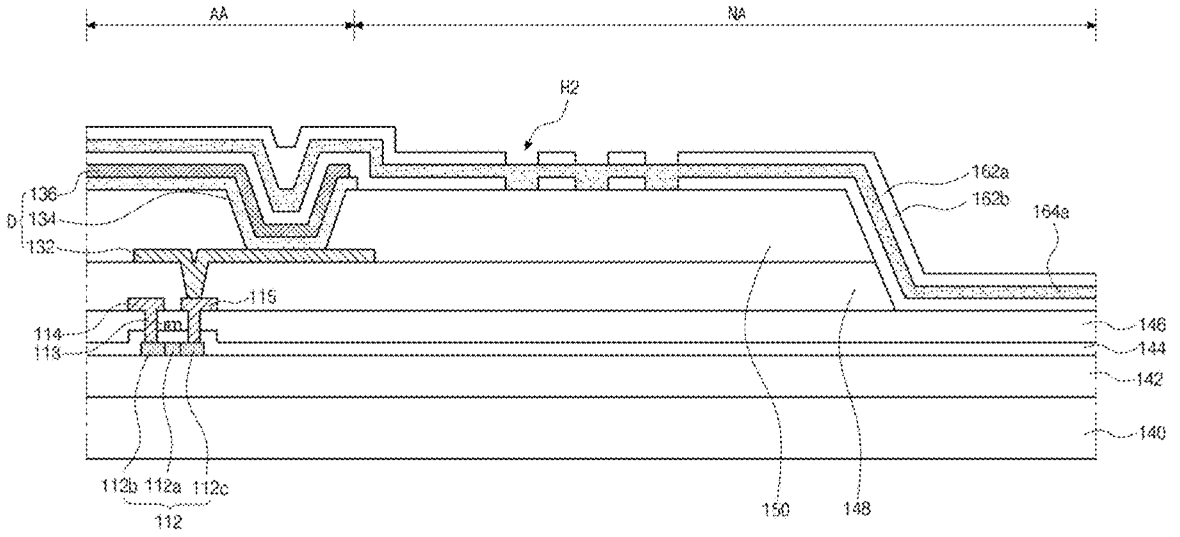

Thereafter, as shown in FIG. 7E, the inorganic material is deposited on the (2-1)th encapsulation layer 164*a* to form a (1-2)th encapsulation layer 162*b* and at least one second hole H2 is formed in the (1-2)th encapsulation layer 162*b* by removing a portion of the (1-2)th encapsulation layer 162*b* in the non-display area NA.

At this time, the first hole H1 of the (1-1)th encapsulation layer 162*a* and the second hole H2 of the (1-2)th encapsulation layer 162*b* are formed at the same location with the same shape and size, so that the first hole H1 and the second hole H2 are aligned as one hole.

Figure 7F:
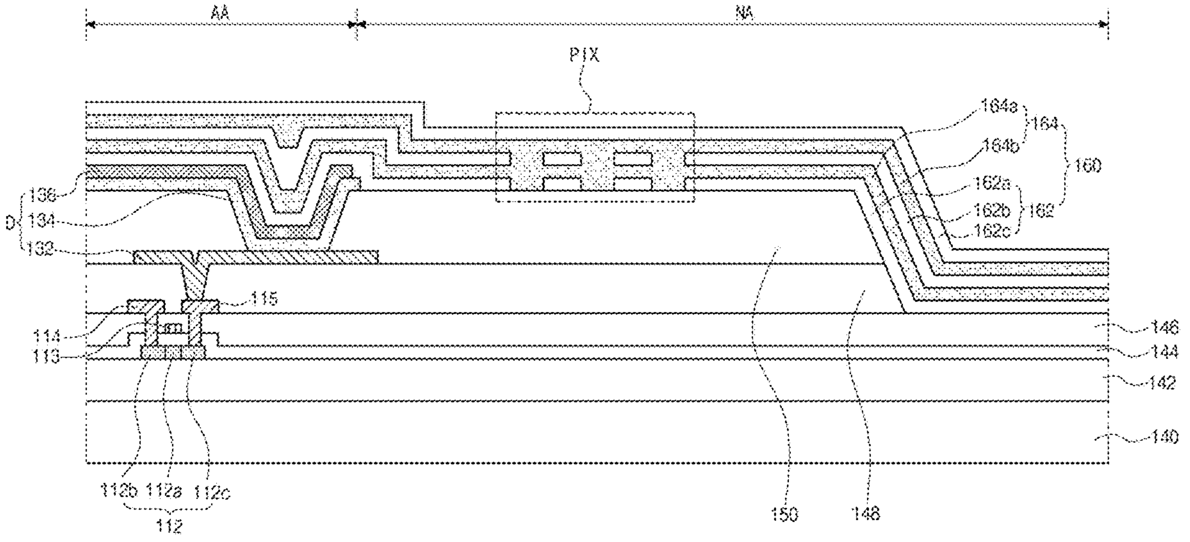

Subsequently, as shown in FIG. 7F, the organic insulating material is deposited on the (1-2)th encapsulation layer 162*b* to form a (2-2) encapsulation layer 164*b*. At this time, the (2-2)th encapsulation layer 164*b* is also formed inside the second hole H2 in the (1-2)th encapsulation layer 162*b*, and the (2-1)th encapsulation layer 164*a* and the (2-2)th encapsulation layer 164*b* are continuously formed through the second hole H2.

Thereafter, as described above, the inorganic materials and the organic materials are repeatedly and alternately deposited to form the plurality of first encapsulation layers 162 and the plurality of second encapsulation layers 164, and then a (1-n) encapsulation layer 162*c* made of the inorganic material is formed at the outermost side. At this time, the holes are formed in the same positions of the plurality of first encapsulation layers 162 except for the outermost layer and the inside of the holes are filled with the organic material, so that the plurality of second encapsulation layers 164 are connected through the holes to form the fixing unit PIX.

Figure 8:
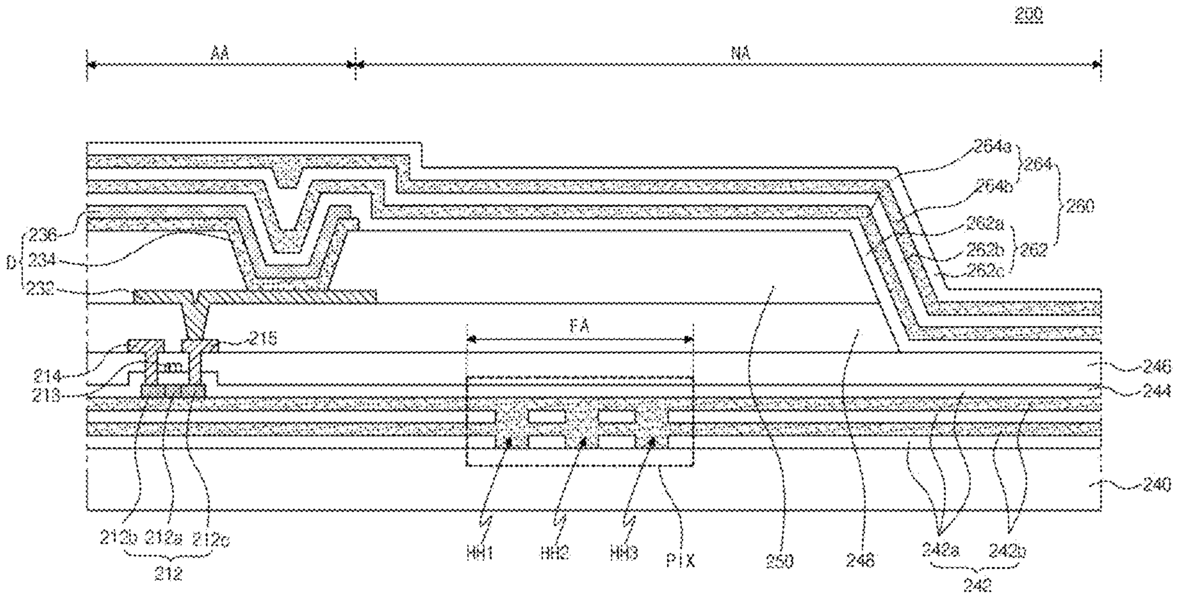
FIG. 8 is a cross-sectional view showing the structure of the display apparatus according to the second embodiment of the present disclosure.

FIG. 8 is the cross-sectional view showing the display apparatus 200 according to a second embodiment of the present disclosure. At this time, descriptions of the same structures as in FIG. 5 will be omitted or simplified, and only other structures will be described in detail.

As shown in FIG. 8, the buffer layer 242 is formed on the substrate 240 in the non-display area NA (or/and display area AA) of the display apparatus 200. The buffer layer 242 is formed by alternately depositing a plurality of first buffer layers 242*a* and a plurality of second buffer layers 242*b*. The plurality of first buffer layers 242*a* and second buffer layers 242*b* may be formed of tens or hundreds of layers, but for convenience of explanation, only three first buffer layers 242*a* and two second buffer layers 242*a* are shown in the figure.

Each of the plurality of first buffer layers 242*a* may be made of the inorganic material such as SiOx or SiNx, but is not limited thereto. Each of the plurality of second buffer layers 242*b* may be made of the organic material such as acrylic resin, epoxy resin, polyimide, polyethylene, or silicon oxycarbon (SiOC), but is not limited thereto.

The thickness of each of the plurality of first buffer layers 242*a* may be from tens of Å to several tens of nm, preferably 15-25 nm, and the thickness of each of the plurality of second buffer layers 242*b* may be from tens of Å to several tens of nm, preferably 5 nm, but is not limited thereto.

A fixing unit PIX is formed in the buffer layer 242 of the non-display area NA. The fixing unit PIX fixes the buffer layer 242 to prevent the buffer layer 242 from being peeled off when the display apparatus 200 is stretched. The fixing unit PIX includes at least one hole H formed in each of the plurality of first buffer layers 242*a* and the second buffer layer 242*b* formed inside the hole H.

Since the plurality of second buffer layers 242*b* are formed continuously by the second buffer layer 242*b* inside the hole H, the adhesion is improved in this area so that the buffer layer 242 is reliably fixed when the display apparatus 200 is stretched.

The hole H can be formed in various shapes. For example, the hole H may be formed in the polygonal shape such as triangle, square, pentagon, or hexagon, or in the circular or oval shape. At this time, all holes H may be formed in the same shape or may be formed in different shapes.

Further, the hole H may be formed in various sizes. For example, all holes H may be formed of the same size or may be formed of different sizes depending on their positions. In case of the stretchable display apparatus 200, the stretchable stress applied to the outmost hole H is largest, so that the size of outmost hole H is largest to maximize the adhesion at this area and the size of the hole H can be decreased as moves toward the display area AA.

The thin film transistor is formed on the buffer layer 242 in the display area AA. The thin film transistor includes the semiconductor pattern 212 disposed on the buffer layer 242, the gate insulating layer 244 covering the semiconductor pattern 212, the gate electrode 213 on the gate insulating layer 244, the interlayer insulating layer 246 covering the gate electrode 213, and the source electrode 214 and the drain electrode 215 on the interlayer insulating layer 246.

The planarization layer 248 is formed over the thin film transistor, and the bank layer 250 and the organic light emitting element D are disposed over the planarization layer 248.

The bank layer 250 is disposed at the boundary of the sub-pixels, and the organic light emitting element D is disposed between the bank layers 250. The organic light emitting element D includes the first electrode 232 disposed on the planarization layer 248, the organic layer 234 disposed on the first electrode 232, and the second electrode 236 disposed on the organic layer 234.

The encapsulation layer 260 is formed over the organic light emitting element D. The encapsulation layer 260 includes the plurality of first encapsulation layers 262 made of the inorganic material and the plurality of second encapsulation layers 264 made of the organic material. The plurality of first encapsulation layers 262 and second encapsulation layers 264 are alternately deposited.

The first encapsulation layer 262 and the second encapsulation layer 264 are formed by alternately depositing tens to hundreds of layers, and the thickness of each layer may be tens of Å to tens of nm, but is not limited thereto.

In the figure, the fixing unit PIX is not formed in the encapsulation layer 260, but the fixing unit PIX having the same structure as shown in FIG. 5 may be formed in the encapsulation layer 260.

The above description and the accompanying drawings are merely illustrative of the technical spirit of the present disclosure, and those of ordinary skill in the art to which the present disclosure pertains can combine configurations within a range that does not depart from the essential characteristics of the present disclosure, various modifications or variations such as separation, substitution and alteration will be possible. Therefore, the embodiments disclosed in the present disclosure are not intended to limit the technical spirit of the present disclosure, but to explain, and the scope of the technical spirit of the present disclosure is not limited by these embodiments.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:

a substrate including a display area and a non-display area;

a buffer layer on the substrate;

a thin film transistor and a light emitting element over the buffer layer, the thin film transistor electrically connected to the light emitting element; and an encapsulation layer over the light emitting element, wherein at least one layer of the buffer layer and the encapsulation layer include a plurality of inorganic layers and a plurality of organic layers, the inorganic layer and the organic layer being alternatively deposited, and wherein the inorganic layer and the organic layer include a fixing member that affixes the respective layers to the substrate, and wherein the fixing member includes at least one hole formed in each of the plurality of inorganic layer and an organic material formed inside of the hole to connect the organic layers.

2. The display apparatus of claim 1, wherein the inorganic layer has a thickness of 15-25 nm.

3. The display apparatus of claim 1, wherein the organic layer has the thickness of 5-15 nm.

4. The display apparatus of claim 1, wherein the hole is formed in one shape of a triangular shape, a square shape, a pentagonal shape, a hexagonal shape, a circular shape, and an oval shape.

5. The display apparatus of claim 1, wherein the display device includes a stretchable display device.

6. The display apparatus of claim 5, wherein the hole is formed in the non-display area.

7. The display apparatus of claim 6, wherein an area of the hole increases from the display area to the non-display area.

8. The display apparatus of claim 7, wherein the area of the hole continuously increases from the display area to the non-display area.

9. The display apparatus of claim 7, wherein the area of the hole stepwise increases from the display area to the non-display area.

10. The display apparatus of claim 1, wherein the display device includes a foldable display device, a bendable display device, and a flexible display device.

11. The display apparatus of claim 10, wherein the hole is formed in one of a folding area, a bending area, and a flexing area.

12. A display apparatus, comprising:

a display panel including a substrate having a display area and a non-display area adjacent to the display area;

a buffer layer over the substrate;

a plurality of fixing units disposed in the non-display area; and wherein the plurality of fixing units are disposed in at least one side of both sides in a stretching direction of the display panel, wherein the buffer layer includes a plurality of first buffer layers made of an inorganic material and a plurality of second buffer layers made of an organic material, the first buffer layers and the second buffer layers being alternatively deposited; and wherein the fixing unit includes the plurality of first buffer layers, the plurality of second buffer layers, and at least one hole formed in each of the plurality of first buffer layers to connect the plurality of second buffer layers.

13. The display apparatus of claim 12, wherein the display panel includes:

a plurality of thin film transistors and a plurality of light emitting elements over the substrate.

14. A display apparatus, comprising:

a substrate including a display area and a non-display area adjacent to the display area, the substrate having an outermost side at a periphery of the substrate;

a thin film transistor on the substrate;

a display element on the thin film transistor, the display element including a first electrode, a second electrode, and an organic layer between the first and second electrodes; and an insulation layer on the substrate, the insulation layer between the display area and the outermost side at the periphery of the substrate; and a plurality of holes in the insulation layer, wherein the encapsulation layer includes a plurality of first encapsulation layers and a plurality of second encapsulation layers, and wherein at least one layer of the plurality of first encapsulation layers includes a hole among the plurality of holes at a first area in the non-display area.

15. The display apparatus of claim 14, wherein the plurality of holes completely extends through at least one layer included in the insulation layer.

16. The display apparatus of claim 14, wherein at least one layer of the plurality of second encapsulation layers is present in the hole.

17. The display apparatus of claim 16, wherein the plurality of second encapsulation layers is continuously and contiguously connected at the first area in the non-display area.

18. The display apparatus of claim 14, wherein the plurality of first encapsulation layers includes an inorganic material and the plurality of second encapsulation layers include an organic material, and wherein the plurality of first encapsulation layers and the plurality of second encapsulation layers are alternatively deposited.

19. The display apparatus of claim 14, wherein the plurality of holes includes a first hole and a second hole in the first area, and wherein the second hole is located in a first direction with respect to the first hole.

20. The display apparatus of claim 19, wherein, when the display apparatus is stretched in the first direction, a dimension of the second hole in the first direction continuously increases as the display apparatus is stretched.

21. The display apparatus of claim 20, wherein, when the display apparatus is stretched in the first direction, a dimension of the first hole in the first direction gradually increases as the display apparatus is stretched, wherein the dimension of the first hole is smaller than the dimension of the second hole when the display apparatus is stretched, and wherein the second hole is closer to the outermost side of the substrate than the first hole.

22. The display apparatus of claim 19, wherein, when the display apparatus is stretched in the first direction, a dimension of the first hole and a dimension of the second hole in the first direction stepwise increases as the display apparatus is stretched.

* * * * *